United States Patent
Steffens et al.

(10) Patent No.: US 11,789,038 B2
(45) Date of Patent: *Oct. 17, 2023

(54) PROBE, MEASURING SYSTEM AND METHOD FOR APPLYING A PROBE

(71) Applicant: Rohde & Schwarz GmbH & Co. KG, Munich (DE)

(72) Inventors: Johannes Steffens, Rosenheim (DE); Hermann Boss, Holzkirchen (DE)

(73) Assignee: Rohde & Schwarz GmbH & Co. KG, Munich (DE)

(*) Notice: Subject to any disclaimer, the term of this patent is extended or adjusted under 35 U.S.C. 154(b) by 0 days.

This patent is subject to a terminal disclaimer.

(21) Appl. No.: 17/701,038

(22) Filed: Mar. 22, 2022

(65) Prior Publication Data

US 2022/0214378 A1 Jul. 7, 2022

Related U.S. Application Data

(63) Continuation of application No. 16/661,807, filed on Oct. 23, 2019, now Pat. No. 11,340,257.

(30) Foreign Application Priority Data

Jan. 24, 2019 (EP) .................................. 19153594

(51) Int. Cl.
*G01R 1/067* (2006.01)
*H04N 23/54* (2023.01)
(Continued)

(52) U.S. Cl.
CPC ......... *G01R 1/06794* (2013.01); *H04N 23/54* (2023.01); *H04N 23/56* (2023.01);
(Continued)

(58) Field of Classification Search
CPC ......... H04N 13/239; H04N 2005/2255; H04N 5/2253; H04N 5/2256; H04N 5/23238;
(Continued)

(56) References Cited

U.S. PATENT DOCUMENTS 6,002,426 A  12/1999 Back et al.
6,091,546 A  7/2000 Spitzer
(Continued)

FOREIGN PATENT DOCUMENTS

CN  103091527 A  5/2013
CN  203191415 U  9/2013
(Continued)

OTHER PUBLICATIONS

Extended European search report for European Patent Application No. 19 15 3594, dated Jul. 31, 2019, 9 pages.
(Continued)

*Primary Examiner* — Farzana Hossain
(74) *Attorney, Agent, or Firm* — Westman, Champlin & Koehler, P.A.

(57) ABSTRACT

The present invention relates to an improved probe for precisely positioning a probe tip at a measurement point. For this purpose, an image capturing device such as a camera may be firmly arranged at the probe. The image capturing device may capture image data around an area of the probe tip. The captured image data may be provided to a user during positioning the probe tip at the desired measuring point.

17 Claims, 4 Drawing Sheets

(51) Int. Cl.
  *H04N 23/56* (2023.01)
  *H04N 23/69* (2023.01)
  *H04N 23/667* (2023.01)
  *H04N 23/68* (2023.01)
  *H04N 23/698* (2023.01)
  *H04N 13/239* (2018.01)
  *H04N 23/50* (2023.01)

(52) U.S. Cl.
  CPC ......... *H04N 23/667* (2023.01); *H04N 23/683* (2023.01); *H04N 23/687* (2023.01); *H04N 23/69* (2023.01); *H04N 23/698* (2023.01); *H04N 13/239* (2018.05); *H04N 23/555* (2023.01)

(58) Field of Classification Search
  CPC ........... H04N 5/23245; H04N 5/23267; H04N 5/23287; H04N 5/23296; H04N 23/54; H04N 23/56; H04N 23/667; H04N 23/683; H04N 23/687; H04N 23/69; H04N 23/698; H04N 23/555; G01R 1/06794; G01R 1/06711
  See application file for complete search history.

(56) References Cited

U.S. PATENT DOCUMENTS

| | | |
|---|---|---|
| 6,349,001 B1 | 2/2002 | Spitzer |
| 7,595,628 B1 | 9/2009 | Hertz et al. |
| 7,868,634 B2 | 1/2011 | Boss et al. |
| 2004/0100297 A1 | 5/2004 | Tanioka et al. |
| 2005/0083038 A1 | 4/2005 | Rothaug et al. |
| 2007/0248261 A1 | 10/2007 | Zhou et al. |
| 2009/0225333 A1 | 9/2009 | Bendall et al. |
| 2010/0118135 A1 | 5/2010 | Vdolek |
| 2013/0027070 A1 | 1/2013 | Dietrich et al. |
| 2014/0213906 A1* | 7/2014 | Li .................... A61B 8/483 600/459 |
| 2015/0164401 A1 | 6/2015 | Toth et al. |
| 2015/0327841 A1* | 11/2015 | Banjanin ............ A61B 8/4263 600/443 |
| 2016/0327383 A1 | 11/2016 | Becker et al. |
| 2016/0335803 A1 | 11/2016 | Tohme et al. |
| 2017/0257619 A1 | 9/2017 | Kashima |
| 2020/0020100 A1* | 1/2020 | Kyriakou ............. G06T 7/0014 |

FOREIGN PATENT DOCUMENTS

| | | |
|---|---|---|
| EP | 3 190 566 A1 | 7/2017 |
| WO | 99/23524 A1 | 5/1999 |
| WO | 2010/108089 A2 | 9/2010 |

OTHER PUBLICATIONS

Daponte et al., "State of the art and future developments of the Augmented Reality for measurement applications", Science Direct—Measurement, Aug. 1, 2014, pp. 53-70.

U.S. Patent Office issued prosecution for U.S. Appl. No. 16/661,807, filed Oct. 23, 2019, including: Applicant Initiated Interview Summary dated Feb. 7, 2022, 2 pages; Applicant Initiated Interview Summary dated Jan. 11, 2022, 2 pages; Non-Final Rejection dated Nov. 30, 2021, 17 pages; Applicant Initiated Interview Summary dated Oct. 21, 2021, 2 pages; Advisory Action and AFCP Decision dated Oct. 8, 2021, 4 pages; Final Rejection dated Aug. 16, 2021, 21 pages; Non-Final Rejection dated Apr. 6, 2021, 18 pages; Advisory Action and AFCP Decision dated Dec. 30, 2020, 4 pages; Final Rejection dated Nov. 18, 2020, 16 pages; Non-Final Rejection dated Jul. 24, 2020, 22 pages; 108 pages total.

* cited by examiner

PROBE, MEASURING SYSTEM AND METHOD FOR APPLYING A PROBE

CROSS-REFERENCE TO RELATED APPLICATIONS

This application is a continuation of U.S. application Ser. No. 16/661,807, filed on Oct. 23, 2019, which published as U.S. Publication No. 2020/0241045 A1, on Jul. 30, 2020, which claims priority to European Patent Application No. 19153594.7, filed on Jan. 24, 2019, the contents of which is hereby incorporated by reference in their entireties.

TECHNICAL FIELD

The present invention relates to a probe for measuring a signal at a measuring point, a measuring system with a probe and a method for applying a probe at a measuring point.

BACKGROUND

Although applicable in principle to any measuring system, the present invention and its underlying problem will be hereinafter described in combination with measuring a signal of a device under test.

Due to the continuous miniaturization of electronic devices, the electronic circuits of the devices also become smaller and smaller. As a consequence, it becomes more and more difficult to get access to a measuring point for measuring a signal of the electronic circuit.

In particular, due to the miniaturization of the electronic circuits it is very difficult or almost impossible to precisely position a probe tip on a desired measurement point for measuring an electronic signal at the measuring point.

For monitoring the quality of devices or for repairing purposes it is necessary to measure the signals at specific measuring points. However, additional magnifying glasses or microscopes are cumbersome and require a complicated handling.

SUMMARY

Against this background, there is the need to provide a probe tip which can be precisely located at a desired measuring point. In particular, the present invention aims to provide an improved probe which can assist a user when positioning the probe tip on a measuring point of an electronic circuit.

The present invention provides a probe tip, a measuring system and a method for applying a probe having the features of the independent claims. Further advantageous embodiments are subject-matter of the dependent claims.

According to a first aspect, a probe for measuring a signal at a measuring point is provided. The probe comprises a probe tip, an image capturing device and an image transmission interface. The probe tip is adapted to contact a measuring point for measuring a signal. The image capturing device is adapted to capture image data of an area around the probe tip. The image transmission interface is adapted to transmit the captured image data to a remote measuring apparatus.

According to a further aspect, a measuring system is provided. The measuring system comprises a probe according to the first aspect and a measuring apparatus. The measuring apparatus comprises an image receiving interface. The image receiving interface is adapted to receive image data transmitted by the image transmission interface of the probe.

According to still a further aspect a method for applying a probe at a measuring point is provided. The method comprises capturing image data of an area around a probe tip of a probe. The image data may be captured by an image capturing device arranged at the probe. The method further comprises transmitting the captured image data to a remote measuring apparatus. The transmission of the captured image data may be performed by an image transmission interface of the probe.

The present invention is based on the considerations that precisely positioning a probe tip on a desired measuring point becomes more and more difficult with a reduced size of electronic circuits. At the one hand-side, the individual measuring points become smaller, and on the other hand-side, individual measuring points are very close together. Accordingly, a user needs additional support for precisely positioning a probe tip on a measuring point.

Thus, it is an idea of the present invention to assist a user when positioning a probe tip on a desired measuring point by additional image data of the environment of a probe tip. For this purpose, an image capturing device such as a camera is mounted on the probe carrying the probe tip. By combining the image capturing device and the probe tip on a probe, the image capturing device can always capture image data of an area of interest, i.e. the area surrounding the probe tip. Accordingly, the captured image data can be provided to a user and the user can monitor the positioning process without the need of any separate devices. In particular, the user does not need to move and control any other external devices such as magnifying glasses or the like.

Accordingly, the probe for measuring a signal according to the present invention comprises both, a probe tip and an image capturing device in combination. Thus, the image capturing device moves around in the same direction as the probe tip, and consequently, the image data captured by the image capturing device always provide image data of an area of interest.

The captured image data may be provided by an image transmission interface, which is also included in the probe. The image transmission interface may provide the image data captured by the image capturing device in any appropriate manner. For example, the images captured by the image capturing device may be provided by an analogue signal and in such a case, the analogue signal may be provided by an image transmission interface. However, it is also possible to provide the image data of the images captured by the image capturing device in digital form. For this purpose, any protocol may be possible.

The image transmission interface may forward the image data of the image capturing device to any appropriate device for displaying the image data. Some examples for providing the image data in an appropriate manner will be described in more detail below.

Further embodiments of the present invention are subject of the further sub-claims and of the following description referring to the drawings.

In a possible embodiment, the image capturing device may comprise a mono camera, a dual camera or a stereo camera.

A mono camera may capture images from a single point of view, i.e. a fixed position with respect to the probe. A dual camera may comprise two separate optical systems for capturing image data. For example, each optical system may have different properties such as opening angle, depth of focus, color characteristics, etc. In particular, the individual camera elements of the dual camera may be directed even to different target points. A stereo camera may capture two almost similar images from different points of view. In this way, it may be possible to obtain three-dimensional information of the captured field of view. However, it is understood that any other appropriate camera system with one or more camera elements may be possible. It may be possible to capture image data of a visible spectrum or even of invisible spectrum, for example infrared or ultraviolet light.

In a possible embodiment, the image capturing device is configured to capture wide-angle images and zoom images.

For example, separate camera elements may be used for simultaneously capturing wide-angle images and zoom images. Alternatively, the image capturing device may be configured to switch between a first mode for capturing wide-angle images and a second mode for capturing zoom images. Furthermore, the zooming and opening angle may be changed dynamically.

In a possible embodiment, the image capturing device is adapted to provide still images and/or an image sequence.

For example, the image capturing device may provide only an individual image upon request. Alternatively, it may be possible to provide a continuous stream of images captured with a predetermined frame rate. Accordingly, a user can easily recognize the movement of the probe tip on the electric circuit.

In a possible embodiment, the probe comprises a switch. The switch may be adapted to switch between an image capturing mode and a signal measuring mode.

By alternatively switching between an image capturing mode and a signal measuring mode, it may be even possible to provide the image data and a measuring signal via a same signal line or cable. Additionally, or alternatively, it may be possible to use a same display for displaying the image data on a screen or alternatively displaying measurement results on the same screen. However, a switch may be also used for simply switching on or off the image capturing device.

In a possible embodiment, the probe comprises a lamp. The lamp may be adapted to illuminate at least the area around the probe tip.

The lamp may be, for example, a light-emitting diode (LED). However, any other appropriate light-emitting element may be also possible. By illuminating the area around the probe tip, images can be even captured in dark areas of an electronic circuit.

In a possible embodiment of the measuring system, the measuring system comprises a visualization device. The visualization device may be configured to display image data received by the image receiving interface.

The visualization device may be any appropriate device for displaying at a received image data. For example, the visualization device may be a display such as a screen. In particular, the visualization device may be a display of a measurement device, which can be also used for displaying measurement results. Some further examples of visualization devices will be described in more detail below.

In a possible embodiment, the visualization device comprises augmented reality glasses.

Augmented reality glasses may provide semitransparent images. Accordingly, the images provided by the semitransparent glasses can be recognized together with the real environment. For example, it may be possible to provide enhanced image data on the augmented reality glasses, which can assist a user when positioning the probe tip on a measuring point. For example, a zoomed image may be provided in the glasses, and a user can recognize the zoomed segment together with the real part of the electronic device.

In a possible embodiment, the visualization device is adapted to provide a three-dimensional representation of the image data received by the image receiving interface.

The three-dimensional representation may be provided by glasses for displaying three-dimensional content. Alternatively, it may be also possible to use any other appropriate technique for displaying three-dimensional content, for example a display screen dealing with polarized light or the like. Accordingly, by providing a three-dimensional representation of the area where the probe tip is moving, the user can be assisted by positioning the probe tip on a measuring point.

In a possible embodiment, the visualization device is adapted to selectively display either the image data received by the image receiving interface or measurement data of a signal measured at the measuring point.

In this way, a same display can be used for displaying the image data and for displaying the measurement results. Hence, the user may always look at a same display during the positioning procedure and during the successive measuring procedure.

In a possible embodiment, the measurement system comprises an optical stabilizing device. The optical stabilizing device may be adapted to compensate a shift in the captured image data, in particular a shift due to unwanted movements of the probe.

The compensation of the shift may be compensated by shifting pixels in the image data. Accordingly, the compensation of the shift is performed in an electronic way by data processing.

In a possible embodiment, the measuring system comprises a mechanical stabilization device. The mechanical stabilizing device may be adapted to mechanically equalize unwanted movements of the probe.

For example, the probe may be fixed to the mechanical stabilizing device such that the mechanical stabilizing device may control the movement of the probe, in particular the probe tip. For example, the mechanical stabilizing device may have a number of one, two, three or even more axis, which can be controlled. In particular, acceleration, tilt, or any other movement may be detected. For example, the mechanical stabilizing device may have an acceleration sensor or the like for detecting unwanted movements.

In a possible embodiment, the method for applying the probe may further comprise a step of receiving the transmitted image data. In particular the reception may be performed by an image receiving interface. The method may further comprise a step of displaying the image data received by the image receiving device. The image data may be displayed on a visualization device. The visualization device may be located at a spatial position remote to the measuring point.

With the present invention it is therefore now possible to assist a user when moving a probe tip in order to precisely position a probe tip at a small sized measuring point. By capturing image data of the probe tip by means of a camera which is mounted in a fixed position of the probe, it is possible to capture image data of an area surrounding the probe tip and providing the captured image data to a user. In particular, the image data may be provided in a magnified form such that a user can easily recognize the detailed position of the probe tip with respect to the desired measuring point. In this way, the positioning procedure of a probe tip on a measuring point can be simplified. The images due to an unwanted movement of the probe tip can be avoided and a probability of short circuits or the like during the measurement procedure can be reduced.

BRIEF DESCRIPTION OF THE DRAWINGS

For a more complete understanding of the present invention and advantages thereof, reference is now made to the following description in conjunction with the accompanying drawings. The invention is explained in more detail below using exemplary embodiments, which are specified in the schematic figures of the drawings, in which.

Figure 1:
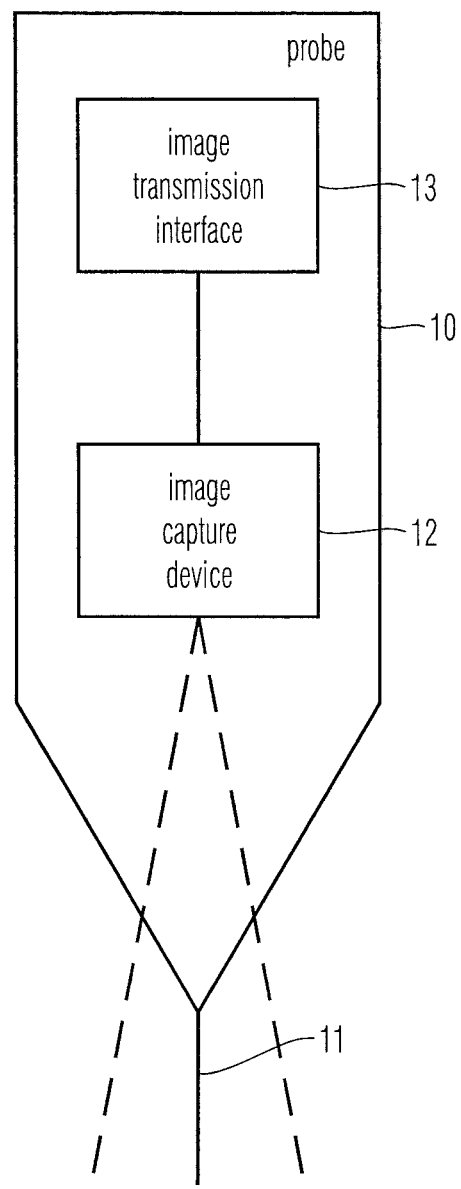
FIG. 1: shows a schematic diagram of a probe according to an embodiment.

The appended drawings are intended to provide further understanding of the embodiments of the invention. They illustrate embodiments and, in conjunction with the description, help to explain principles and concepts of the invention. Other embodiments and many of the advantages mentioned become apparent in view of the drawings. The elements in the drawings are not necessarily shown in scale.

In the drawings, same, functionally equivalent and identical operating elements, features and components are provided with same reference signs in each case, unless stated otherwise.

DETAILED DESCRIPTION OF THE DRAWINGS

FIG. 1 shows a schematic diagram of a probe 10 according to an embodiment. Probe 10 comprises at least a probe tip 11, an image capturing device 12 and an image transmission interface 13. Probe tip 11 may be an electric conductive tip for contacting a measurement point. For example, the measurement point may be a pin of an integrated circuit or another contact point of an electronic circuit. However, it is understood that probe tip 11 may be also able to contact any other appropriate measuring point of an electronic circuit. Probe 10 may further comprise a port or a cable for electrically connecting probe tip 11 with an input port of a measurement device.

Probe 10 further comprises the image capturing device 12. In particular, image capturing device 12 may be firmly attached to a housing of probe 10. The field of view of image capturing device 12 may be directed to probe tip 11. Accordingly, image capturing device 12 may capture images of an area surrounding probe tip 11. Thus, when probe 10 with probe tip 11 is moving around on an electric circuit, image capturing device 12 may capture an image of probe tip 11 and the related area of the electric device. In this way, image capturing device 12 may capture images from potential measuring points, which may be contacted by probe tip 11.

Image capturing device 12 may be a camera for capturing image data related to visible wavelength. In particular, image capturing device 12 may be a monochromatic or a colored camera for capturing image data. However, it may be also possible that image capturing device 12 may capture infrared or ultraviolet wavelength.

Image capturing device 12 may have a fixed, predetermined field of view related to a specific opening angle. However, it may be also possible that the field of view, in particular the opening angle of image capturing device 12 may be variable. Accordingly, the scale of zoom may be changed, for example may be changed depending on a desired application. For example, when dealing with very small sized devices, image capturing device 12 may capture a small field of view with a very high resolution. Furthermore, when dealing with devices of a larger scale, a larger field of view with a lower resolution may be captured by image capturing device 12. The field of view and consequently the resolution may be adapted either manually or automatically.

Image capturing device 12 may continuously capture images, and provide the captured images as a continuous sequence with a predetermined frame rate. Alternatively, it may be also possible that image capturing device 12 may only capture a single image upon request. For example, image capturing device 12 may be triggered by an automated or manually provided trigger signal and provide a single image upon receiving the trigger signal. However, any other approach for providing images may be also possible.

Image capturing device 12 may provide the captured image data to image transmission interface 13, and image transmission interface 13 may forward the image data to a corresponding remote device. Examples for such remote devices will be described in more detail below.

Figure 2:
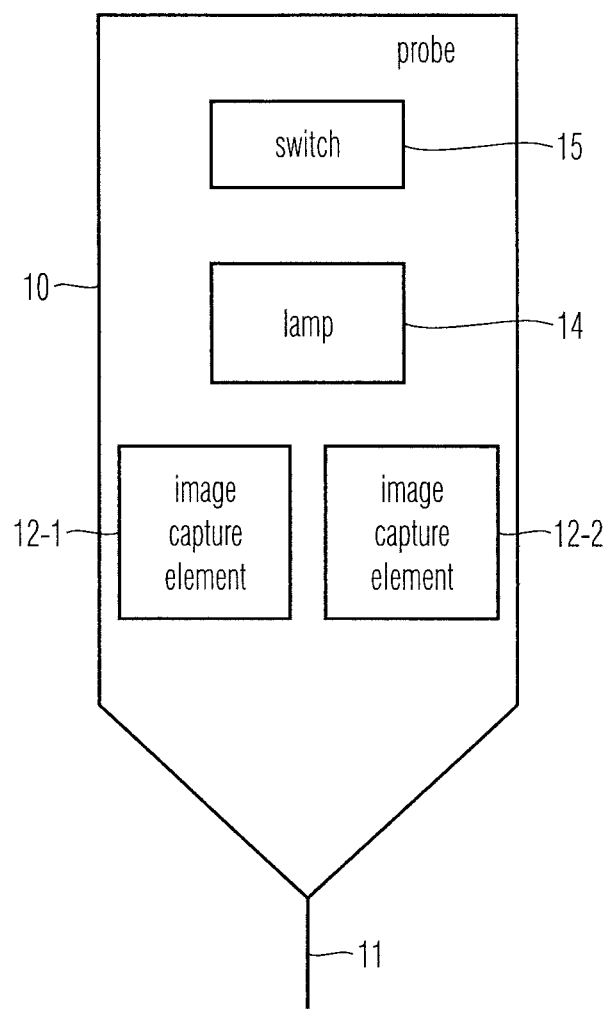
FIG. 2: shows a schematic diagram of another embodiment of a probe.

FIG. 2 shows a block diagram of a probe 10 according to a further embodiment. The embodiment according to FIG. 2 differs from the previously described embodiment in that the image capturing device 12 comprises two image capturing elements 12-1 and 12-2. For example, the two image capturing elements 12-1 and 12-2 may be image capturing elements of a dual camera or a stereo camera. In case of a stereo camera, the two image capturing elements 12-1 and 12-2 capture images of a common area from different points of view. In this way, it is possible to obtain a three-dimensional view of the captured area.

Furthermore, it may be also possible that the two image capture elements 12-1 and 12-2 are directed to different areas and/or the two image capturing elements 12-1 and 12-2 may have different opening angles. For example, a first image capturing element 12-1 may capture wide-angle images, and a second image capturing element 12-2 may capture zoom images with a smaller opening angle. Furthermore, it may be even possible to use more than two image capturing elements 12-1 and 12-2.

To illuminate the area covered by the one or more image capturing elements 12-i, a lamp 14 may be arranged on the probe 10. For example, the lamp may comprise one or more light-emitting diodes (LED) or any other kind of light-emitting element. In particular, the emitted light may be directed in the direction of the probe tip 11.

Furthermore, probe 10 may comprise a switch (15) for switching between a first operation mode for capturing image data by the image capturing element 12 and a second mode for measuring signals by probe tip 11. In particular, the image capturing element 12 may be switched off in the second operation mode. However, it may be also possible to maintain the operation of the image capturing element 12 when measuring the electric signals by probe tip 11. In this way, it may be further possible to monitor the correct position of the probe tip at the measuring point during the measurement.

Figure 3:
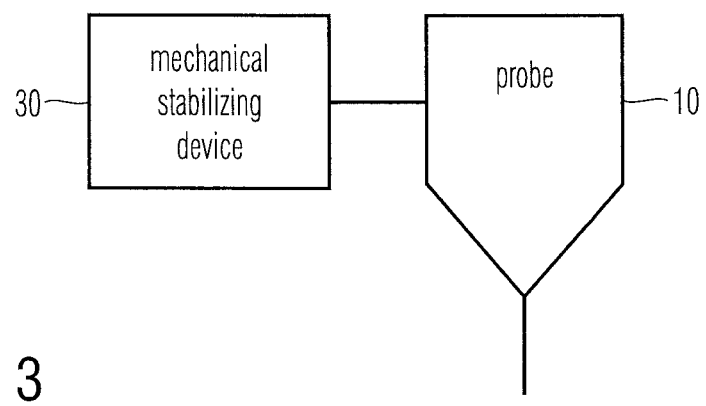
FIG. 3: shows a schematic diagram of still another embodiment of a probe.

FIG. 3 shows a block diagram of a further embodiment with a probe 10. Probe 10 in this embodiment mainly corresponds to the previously described probes 10 according to FIG. 1 or FIG. 2. Further, probe 10 may be mounted on a mechanical stabilizing device 30. The mechanical stabilizing device 30 may mechanical equalize an unwanted movement of the probe 10. For this purpose, the mechanical stabilizing device 30 may comprise one or more controllable axis for moving or rotating probe 10. In this way, the spatial position of probe 10 with the probe tip 11 may be spatially stabilized. For example, a gyroscope or an acceleration sensor or the like may be used for detecting a movement. Upon detecting an unwanted movement, the mechanical stabilizing device 30 may provide a controlled reaction for compensating such an unwanted movement.

Furthermore, the image data provided by image capturing device 12 may be analyzed in order to detect a movement of probe 10 and in response to such a detection of an unwanted movement, mechanical stabilizing device 30 may provide an appropriate response for compensating such an unwanted movement.

Additionally, or alternatively, the image data provided by image capturing device 12 may be also compensated in order to obtain a stabilized image. For this purpose, pixels in the image data may be shifted to compensate unwanted movement in a resulting image. In this way, the image data may be processed in order to obtain stabilized image data.

Figure 4:
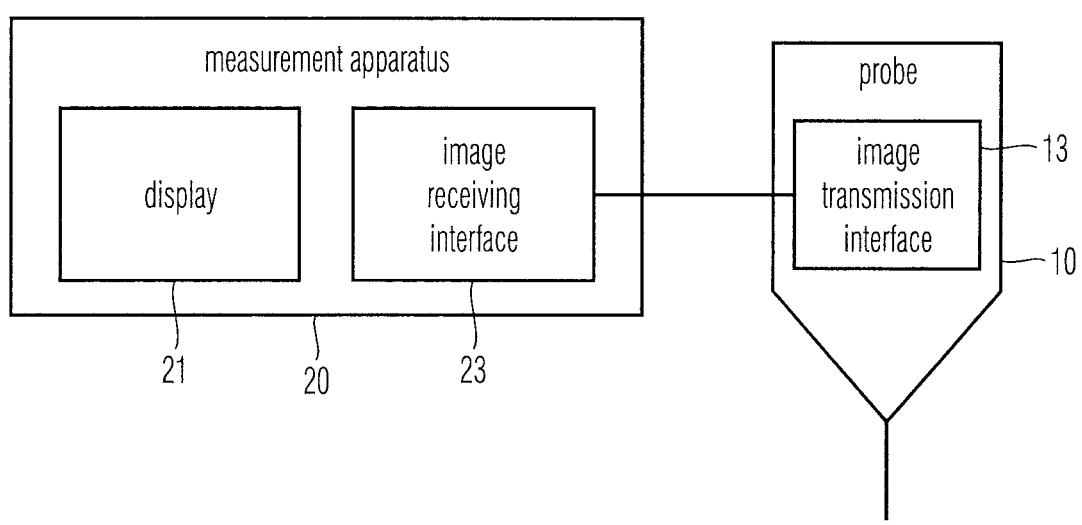
FIG. 4: shows a schematic diagram of an embodiment of a measurement system.

FIG. 4 shows a block diagram of a measurement system according to an embodiment. The measurement system comprises a probe 10, for example a probe 10 as described above in connection with FIG. 1 to FIG. 3. Probe 10 may be connected to a measuring apparatus 20. For example, probe 10 may be connected to measuring apparatus 20 by means of a cable. In particular, a single cable may be used for connecting probe 10 and measuring apparatus 20. However, it may be also possible to use separate cables for connecting the probe tip 11 with measuring apparatus 12 and for connecting the image transmission interface 13 with a corresponding image receiving device 23 of the measuring apparatus 20.

Image receiving device 23 of measuring apparatus 20 may receive the image data provided by image transmission interface 13. The received image data may be processed and displayed on an appropriate display 21 of measuring apparatus 20. For example, a same display 21 may be used for displaying measurement results and for displaying the image data provided by image capturing device 12. For this purpose, it may be possible to switch between an image capturing mode for displaying the image data and a measuring mode for displaying the measurement results. Furthermore, it may be possible to provide the measurement results and the image data simultaneously. For example, a picture in picture configuration may be used, or the screen may be split for displaying the measurement results in a first part of the screen and displaying the image data in a second part of the screen. However, any other configuration of the screen may be also possible for providing image data and/or measurement results.

Figure 5:
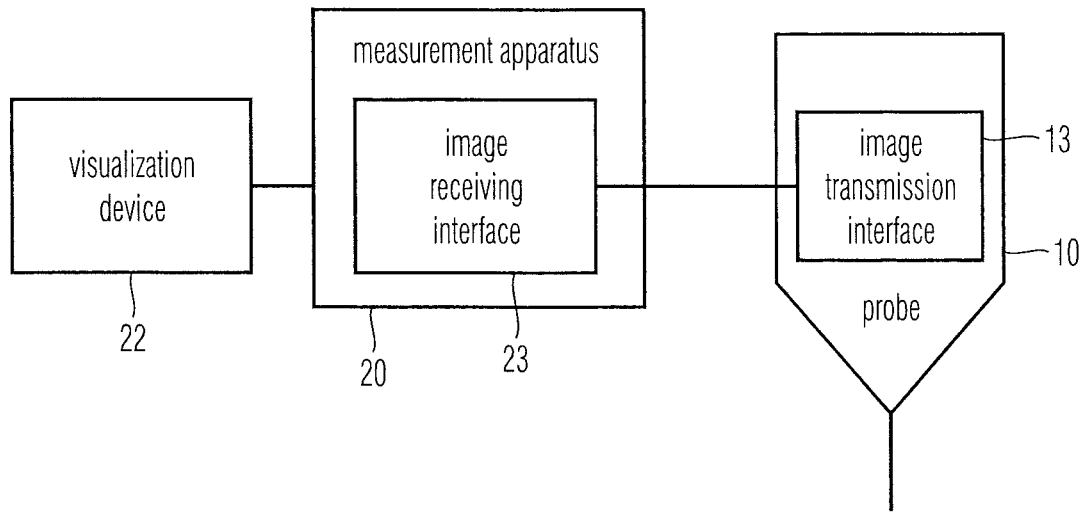
FIG. 5: shows a schematic diagram of another embodiment of a measurement system.

FIG. 5 shows a block diagram of a measurement apparatus according to a further embodiment. The measurement system according to FIG. 5 mainly corresponds to the previously described measurement signal according to FIG. 4. The measurement signal according to FIG. 5 differs from the previously described measurement signal by a separate visualization device 22. For example, visualization device 22 may comprise a visualization device for a three-dimensional visualization of image data, in particular of image data provided by a stereo camera of a probe 10. For example, visualization device 20 may comprise glasses, in particular augmented reality glasses or virtual reality glasses for providing separate image content for each eye of a user. However, it may be also possible to provide the image content on any other kind of visualization device, in particular any kind of display such as a two-dimensional display or a display for providing three-dimensional image content.

Figure 6:
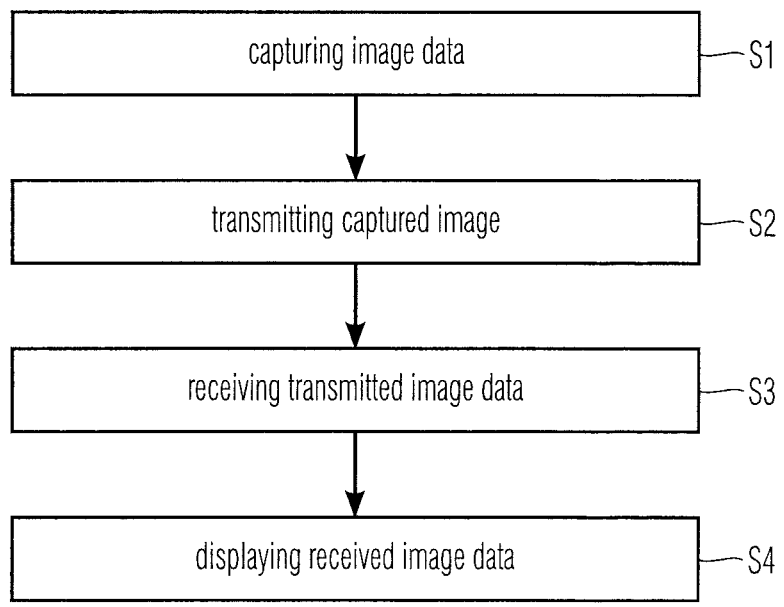
FIG. 6: shows a flow diagram of a method according to an embodiment of the present invention.

FIG. 6 shows a block diagram of a method for applying a probe at a measurement point. In a step S1 image data are captured of an area around a probe tip 11 of a probe 10 by an image capturing device 12 arranged at the probe 10. In a step S2 the captured image data are transmitted to a remote measuring apparatus 20 by an image transmission interface 13 of the probe 12.

Furthermore, in a step S3 the transmitted image data may be received by an image receiving interface 23, and in a step S4 the received image data may be displayed at a visualization device 21, 22, which is arranged to remote to a measuring point.

Summarizing, the present invention relates to an improved probe for precisely positioning a probe tip at a measurement point. For this purpose, an image capturing device such as a camera may be firmly arranged at the probe. The image capturing device may capture image data around an area of the probe tip. The captured image data may be provided to a user during positioning the probe tip at the desired measuring point.

Although the present invention has been described in the above by way of preferred embodiments, it is not limited thereto, but rather can be modified in a wide range of ways. In particular, the invention can be changed or modified in various ways without deviating from the core of the invention.

We claim:
1. A measuring system, the measuring system comprising:
a probe for measuring a signal at a measuring point and
a measuring apparatus remote from the probe,
a mechanical stabilizing device adapted to mechanically equalize unwanted movement of the probe,
wherein the probe comprises:
  a probe tip adapted to contact a measuring point for measuring an electric signal;
  an image capturing device adapted to capture image data of the probe tip and an area around the probe tip, wherein the image capturing device comprises multiple optical systems capturing two almost similar images from different points of view to obtain three-dimensional information of a captured field of view, each of the multiple optical systems having different optical properties; and
  an image transmission interface adapted to transmit the captured image data to the measuring apparatus remote from the probe;
wherein the measuring apparatus remote from the probe comprising:
  an image receiving interface adapted to receive the image data transmitted by the image transmission interface of the probe.

2. The measuring system of claim 1, wherein the mechanically stabilizing device comprises one or more controllable axis for moving or rotating the probe.

3. The measuring system of claim 2, further comprising a gyroscope for detecting a movement of the probe.

4. The measuring system of claim 1, wherein the image capturing device is adapted to simultaneously capture wide-angle images and zoom images.

5. The measuring system of claim 1, wherein the image capturing device is adapted to provide still images.

6. The measuring system of claim 1, wherein the image capturing device is adapted to provide an image sequence.

7. The measuring system of claim 1, wherein the probe further comprises a lamp which is adapted to illuminate at least the area around the probe tip.

8. The measuring system of claim 1, wherein a same signal line or cable is used for transmitting the captured image data in an image capturing mode and for transmitting a measurement signal of the measured electric signal in the signal measurement mode.

9. The measuring system of claim 8, further comprising a switch for switching between the image capturing mode and the signal measurement mode.

10. The measuring system of claim 1, further comprising a visualization device adapted to display the image data received by the image receiving interface.

11. The measuring system of claim 10, wherein the visualization device comprises augmented reality glasses.

12. The measuring system of claim 10, wherein the visualization device is adapted to provide a three-dimensional representation of the image data received by the image receiving interface.

13. The measuring system of claim 10, wherein the visualization device is adapted to selectively display either the image data received by the image receiving interface or measurement data of a signal measured at the measuring point.

14. The measuring system of claim 1, wherein the image data provided by the image capturing device is further analyzed to detect movement of the probe.

15. The measuring system of claim 1, wherein the image data provided by the image capturing device is compensated in order to obtain a stabilized image by shifting pixels in the image data to compensate unwanted movement in a resulting image.

16. The measuring system of claim 3 further comprising an acceleration sensor for detecting movement of the probe.

17. The measuring system of 1, wherein the image capturing device comprises stereo cameras.

* * * * *